United States Patent
Lemoff et al.

(10) Patent No.: US 6,882,044 B2
(45) Date of Patent: Apr. 19, 2005

(54) HIGH SPEED ELECTRONIC INTERCONNECTION USING A DETACHABLE SUBSTRATE

(75) Inventors: Brian E. Lemoff, Union City, CA (US); Lisa A. Buckman, San Francisco, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/150,303

(22) Filed: May 17, 2002

(65) Prior Publication Data

US 2003/0213963 A1 Nov. 20, 2003

(51) Int. Cl.[7] ............................................. H01L 23/34
(52) U.S. Cl. ...................... 257/723; 257/685; 257/690; 257/692; 257/782; 257/773
(58) Field of Search ............................. 257/685, 690, 257/692, 723, 782, 773, 81, 208, 211, 758, 923, 433, 668, 684, 784

(56) References Cited

U.S. PATENT DOCUMENTS

| | | | | |
|---|---|---|---|---|
| 5,060,052 A | * | 10/1991 | Casto et al. | 257/723 |
| 5,184,207 A | | 2/1993 | Cain | |
| 5,309,322 A | | 5/1994 | Wagner et al. | |
| 6,013,946 A | | 1/2000 | Lee et al. | |
| 6,146,813 A | * | 11/2000 | Girard et al. | 430/319 |
| 6,177,722 B1 | * | 1/2001 | Kovats et al. | 257/690 |
| 2002/0004257 A1 | * | 1/2002 | Takaoka et al. | 438/107 |

FOREIGN PATENT DOCUMENTS

JP          04-212167       *  3/1992

* cited by examiner

*Primary Examiner*—Minhloan Tran
*Assistant Examiner*—Tan Tran

(57) ABSTRACT

Conductors to interconnect electronic devices, the conductors being formed on a detachable substrate. The substrate is aligned with a package containing electronic devices. The conductors are bonded to pads on the devices. Then, the substrate is detached. Each conductor is self supporting between the devices, has a two dimensional shape and has a surface that is substantially parallel to a surface of the pads.

15 Claims, 4 Drawing Sheets

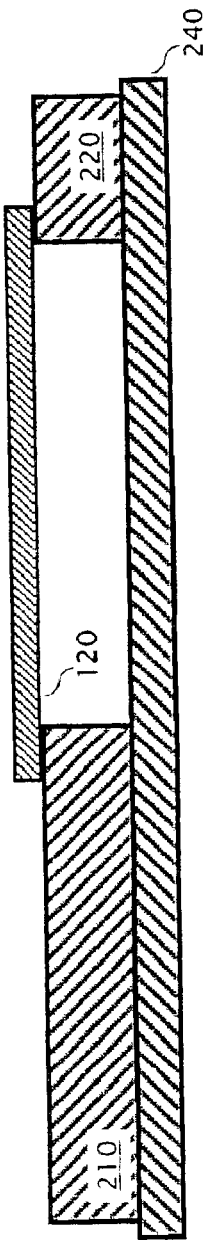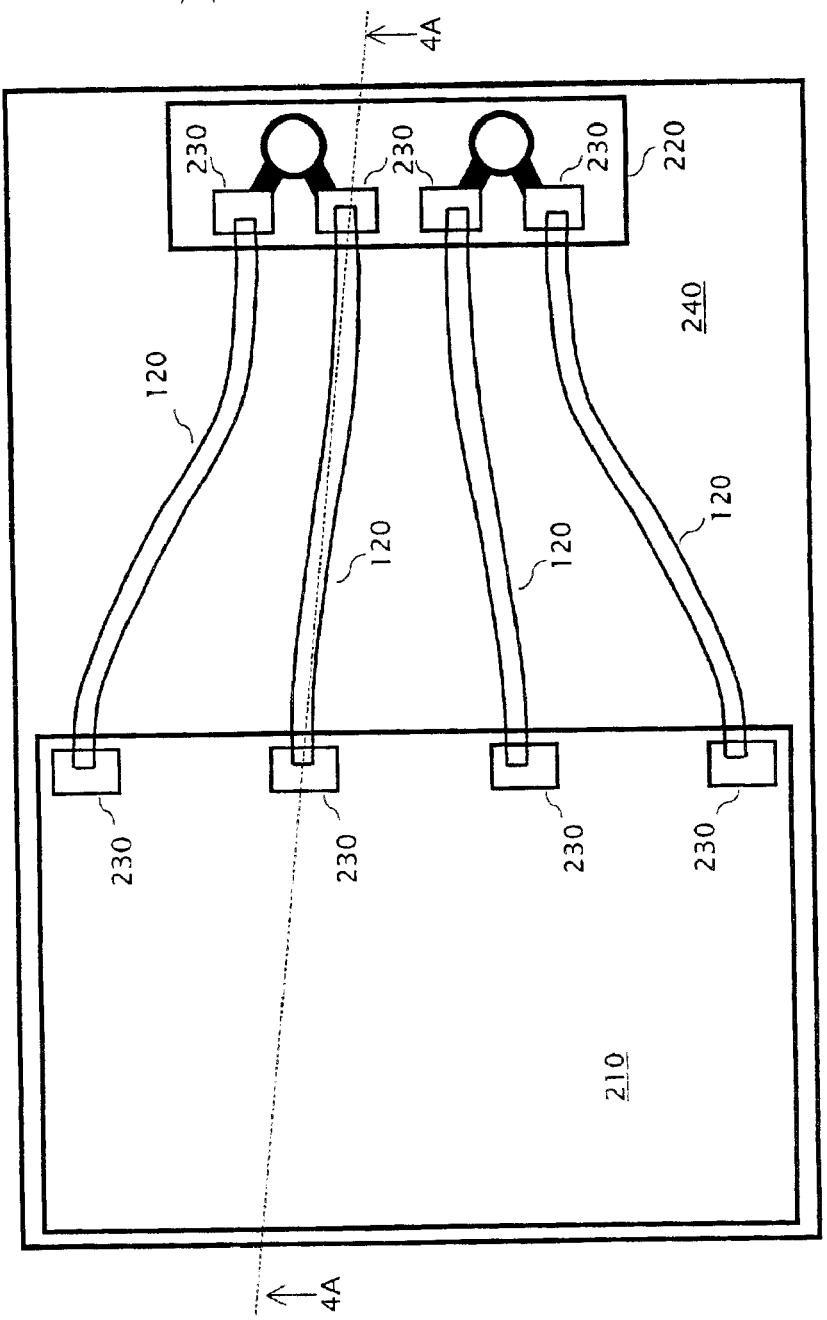

HIGH SPEED ELECTRONIC INTERCONNECTION USING A DETACHABLE SUBSTRATE

BACKGROUND

1. Field of the Invention

The invention relates generally to interconnecting electronic devices and alternatively, to bonding conductors to opto-electronic devices.

2. Discussion of the Related Art

Opto-electronic devices are semiconductor devices that emit light, that detect incoming light, or that alter and re-emit light. Modern research and technology have made the use of opto-electronic devices commonplace in the lives of many individuals, although for many people such use is unknowing.

One major application of opto-electronic devices is in fiber optic communications. Over approximately the last two decades, fiber optic lines have taken over and transformed the long distance telephone industry. Optical fibers also play a dominant role in making the Internet available around the world. When optical fiber replaces copper wire for long distance calls and Internet traffic, costs are dramatically lowered and the rate at which information can be conveyed is increased.

Optical fibers convey voice, Internet traffic and other information digitally at speeds or data rates that currently range upward from one gigabit per second, and that are expected to reach hundreds of gigabits per second or more. In order to achieve these data rates, an opto-electronic device emits a beam of light that is turned on and off at the data rate that is at upward of one billion times each second. On the other end of the fiber optic cable, another opto-electronic device receives that beam of light and detects the pattern with which it is turned on and off.

Long distance fiber optical lines are commonplace. After a certain distance, light signals on optical fibers must be converted into electronic signals, electronically amplified and perhaps adjusted, and then re-emitted as light signals.

Opto-electronic emitters must receive from electronic devices the information they send optically, and opto-electronic detectors must send to electronic devices the information they receive optically. At least for the electronic devices that connect directly to the opto-electronic devices, this information must be sent at the same data rate as the information is carried on the optical fiber.

Unfortunately, at these data rates electronic interconnections can be problematic. The problems encountered include, among others, unintentional or parasitic effects. A wire that interconnects two electronic devices can create a small parasitic inductance and capacitance in the circuit, but at these data rates even small parasitic effects in circuits can have substantial effects on system performance. When such wires are placed close together, a parasitic coupling can be created between the signals on the two wires. Such parasitic effects distort the electronic signals on the wires, which can force the designers of opto-electronic systems to reduce the data rate at which the system operates, in order to reduce the effects of the distortions.

The electrical conductors used at these data rates should be as short as possible in order to minimize parasitic effects such as capacitance and inductance.

To increase bandwidth density, it is often preferable for the opto-electronic devices to be arranged in tightly spaced arrays. Bandwidth density measures the bandwidth of information that can be sent from, or received by, devices that fit within a unit of length along the side of a device, package or circuit board, or that fit within a unit of area of a device, package or circuit board. The former measure of bandwidth density can be expressed as gigabits per second per meter, and the latter measure as gigabits per second per square meter.

Preferably, the spacing used in such arrays is determined by the optics part of the system, not the electronic devices that drive the opto-electronic devices. Arrays of opto-electronic devices may be used to transmit light signals that are conveyed by a ribbon-like bundle of optical fibers. Or, a single optical fiber that carries different signals at different wavelengths may be used with such an array, where each opto-electronic device in the array operates at a different wavelength.

The electrical conductors used at these data rates should be as uniformly spaced as possible. This both prevents accidental connections between the conductors and minimizes parasitic coupling between the conductors.

Other problems arise from the requirement that such opto-electronic devices be produced in volume. Millions of opto-electronic devices are in use today. Production rates in excess of one million units per month are occurring, or are projected for the immediate future. In order to meet these demands for volume production, the process of interconnecting opto-electronic devices with electronic devices must be inexpensive and reliable. This suggests that the interconnection process be highly automated.

SUMMARY OF THE INVENTION

The invention provides a solution to the problems described above by providing a novel method of interconnecting electronic devices including, among others, opto-electronic devices.

A plurality of conductors is formed on a substrate, the substrate being aligned with a plurality of electronic devices such that each conductor aligns with pads on different ones of the electronic devices. Each conductor is bonded to the pads. Then, the substrate is detached from the conductors.

Some embodiments of the invention comprise a package including a plurality of electronic devices with conductors bonded to the pads of the devices. Each conductor is self supporting between the devices, has a two dimensional shape and has a surface that is substantially parallel to a surface of the pads.

Other embodiments of the invention comprise a substrate and a plurality of conductors configured to be used in interconnecting electronic devices, wherein the conductors are detachably attached to the substrate and are otherwise physically independent of each other.

BRIEF DESCRIPTION OF THE DRAWING

The drawing illustrates technologies related to the invention, shows example embodiments of the invention, and gives examples of using the invention. The objects, features and advantages of the invention will become more apparent to those skilled in the art from the following detailed description, when read in conjunction with the accompanying drawing, wherein:

FIGS. 4A and 4B respectively show a cross section and a top view, according to an embodiment of the invention, of another example package with two electronic devices interconnected by curved conductors.

DETAILED DESCRIPTION OF PREFERRED EMBODIMENTS

The descriptions and discussions herein illustrate technologies related to the invention, show examples of the invention and give examples of using the invention. Known methods, procedures, systems, circuits or components may be discussed without giving details, so as to avoid obscuring the principles of the invention. On the other hand, numerous details of specific examples of the invention may be described, even though such details may not apply to other embodiments of the invention. Details are included and omitted so as to better explain the invention and so as to aid in understanding the invention.

The invention is not to be understood as being limited to or defined by what is discussed herein; rather, the invention may be practiced without the specific details described herein. One skilled in the art will realize that numerous modifications, variations, selections among alternatives, changes in form, and improvements can be made without departing from the principles, intention or legal scope of the invention.

Figure 1A:
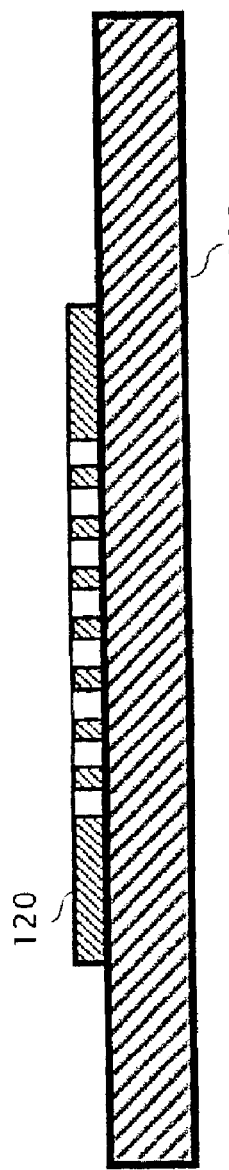
FIGS. 1A and 1B respectively show, according to an embodiment of the invention, a view from the side along a cross sectional cut line and a view from the top of several example conductors that have been formed on a substrate and that have a tapered and meshed shape.
Figure 1B:
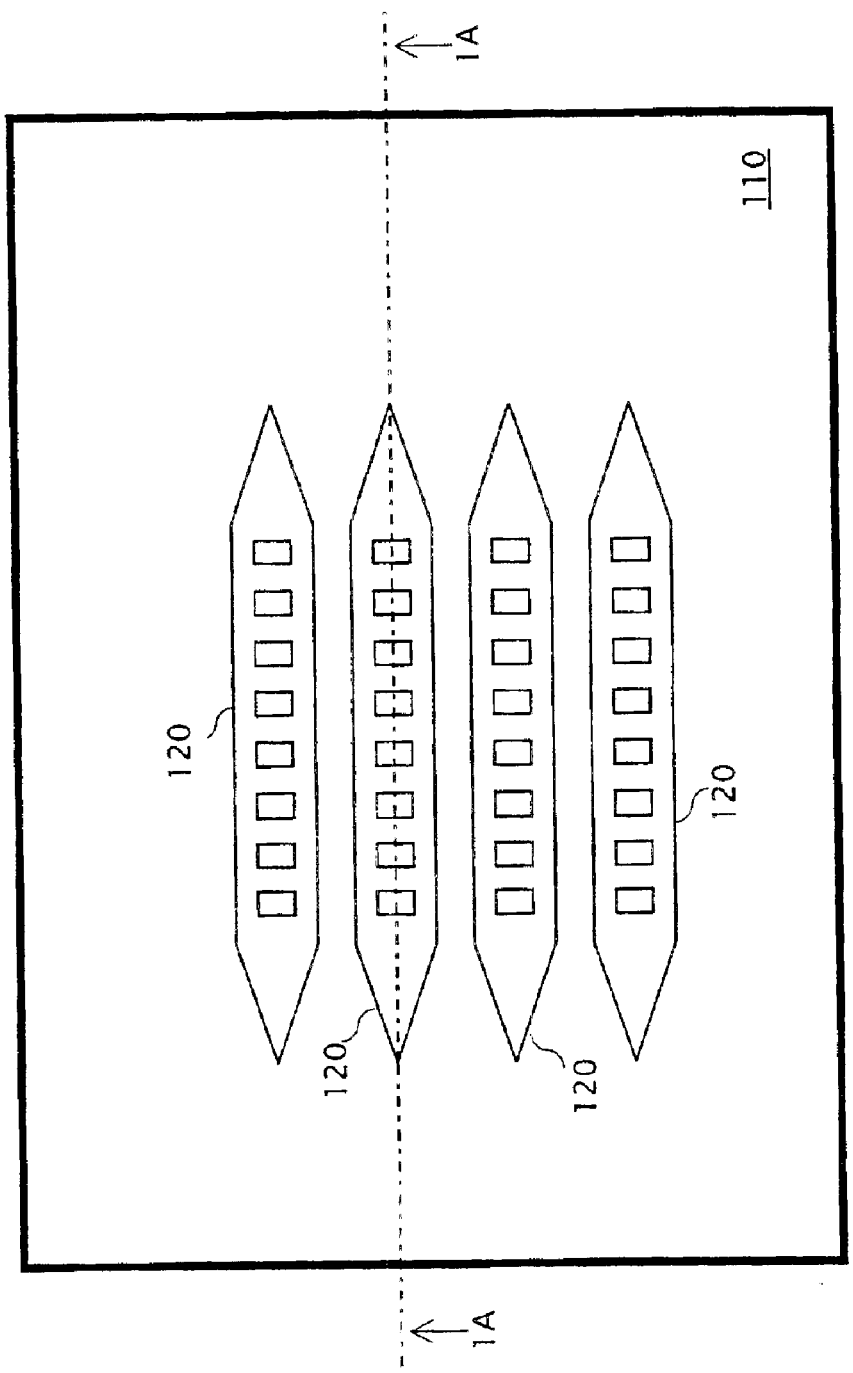

In the drawing, FIGS. 1A and 1B show several example conductors 120 that have been fabricated on an example substrate 110 according to an embodiment of the invention. In some embodiments of the invention, the conductors are attached to the substrate with an adhesive.

In various embodiments of the invention, substrate 110 may be made from one or more of a material based on: silicon; glass; a polyimide; an acrylic; a cellophane; a mixture of some of these or other materials; a layered structure of these or other materials; or other materials. The conductivity of substrate 110 is relatively unimportant, but substrate 110 should be a material or set of materials that detach cleanly from conductors 120 at the appropriate time.

Substrate 110 has an active surface that is substantially planar and to which conductors 120 are attached in such a manner that they can be later detached.

Conductors 120 may be formed out of any conductive material. Examples of metals suitable for conductors 120 include, among others: gold; aluminum; copper; nickel; alloys of two or more of these or other metals; or layered or plated combinations of these or other metals or their alloys.

Figure 2A:
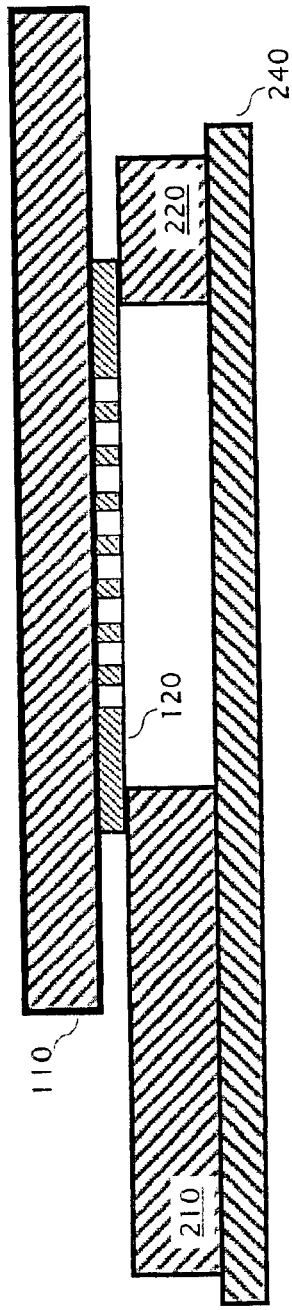
FIGS. 2A and 2B respectively show a cross section and a top view, according to an embodiment of the invention, of the same example substrate and conductors after the substrate is aligned with an example package that holds two electronic devices.
Figure 2B:
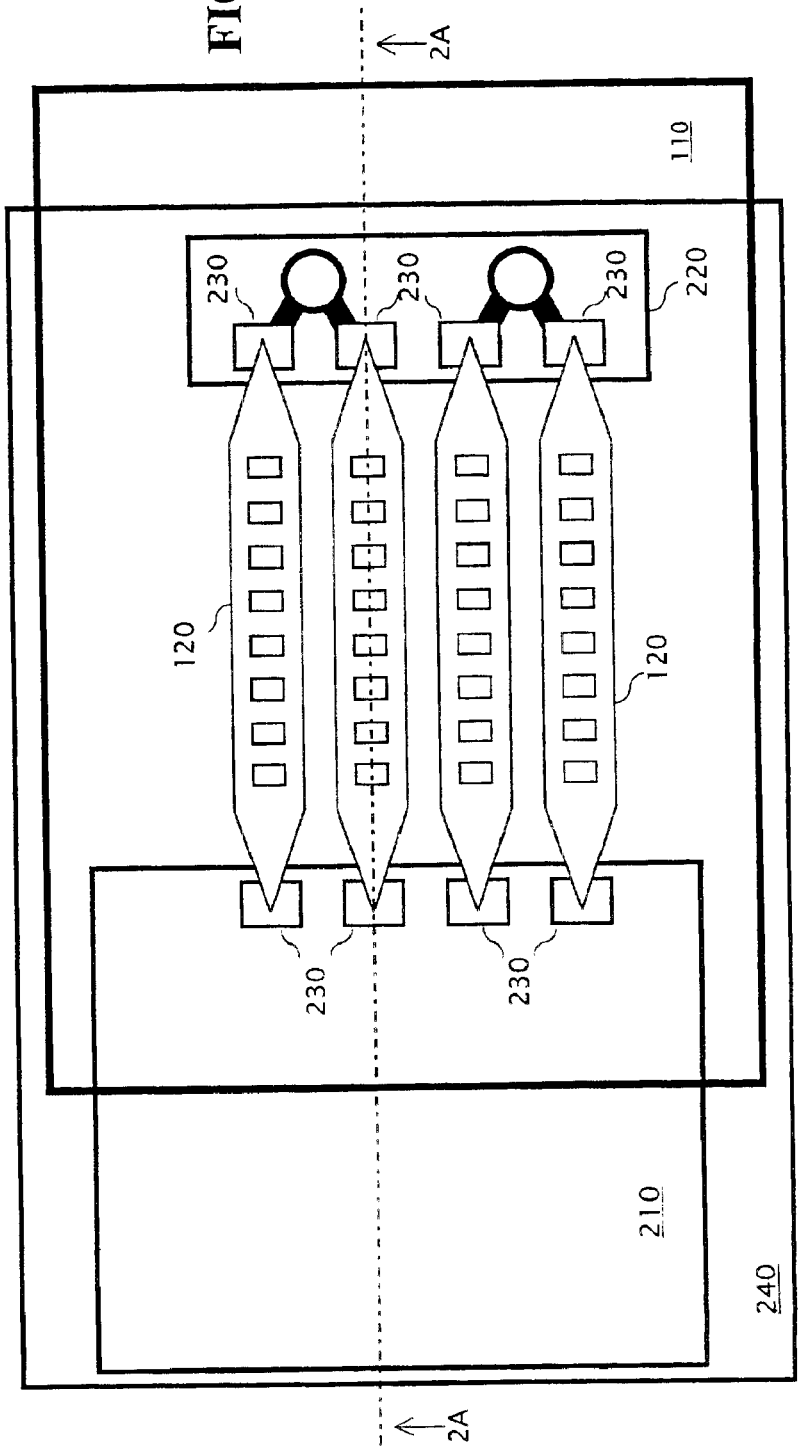

FIGS. 2A and 2B show the same example substrate and conductors, according to an embodiment of the invention, after the substrate is aligned with an example package.

Package 240 holds electronic device 210 and opto-electronic device 220. Package 240 may be any material, device or mounting that secures electronic device 210 and opto-electronic device 220 device into a stable position relative to each other.

In various embodiments of the invention, at least one of the electronic devices to be interconnected is an opto-electronic device, which may include but is not limited to: a semiconductor laser; a photodiode; an electro-optic device; a light emitting diode; an electro-absorption modulator; a semiconductor optical amplifier; or a combination thereof.

Each of electronic device 210 and opto-electronic device 220 has a surface that includes pads 230, each pad providing an electrical connection to a node of a circuit within the device.

Figure 3A:
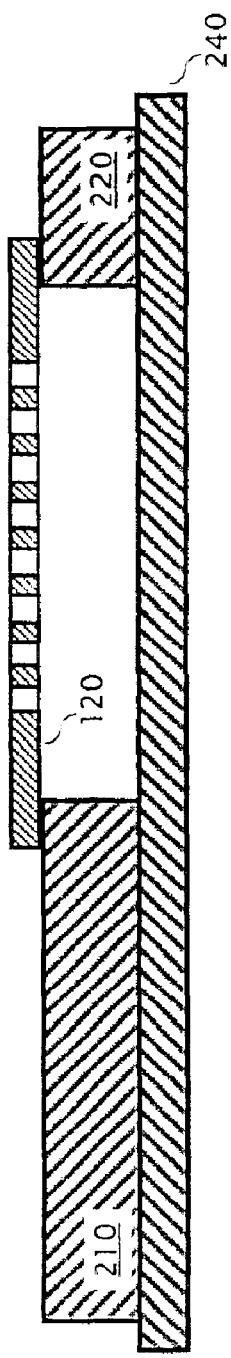
FIGS. 3A and 3B respectively show a cross section and a top view, according to an embodiment of the invention, of the same example package with the electronic devices interconnected by the conductors after the substrate is removed.
Figure 3B:
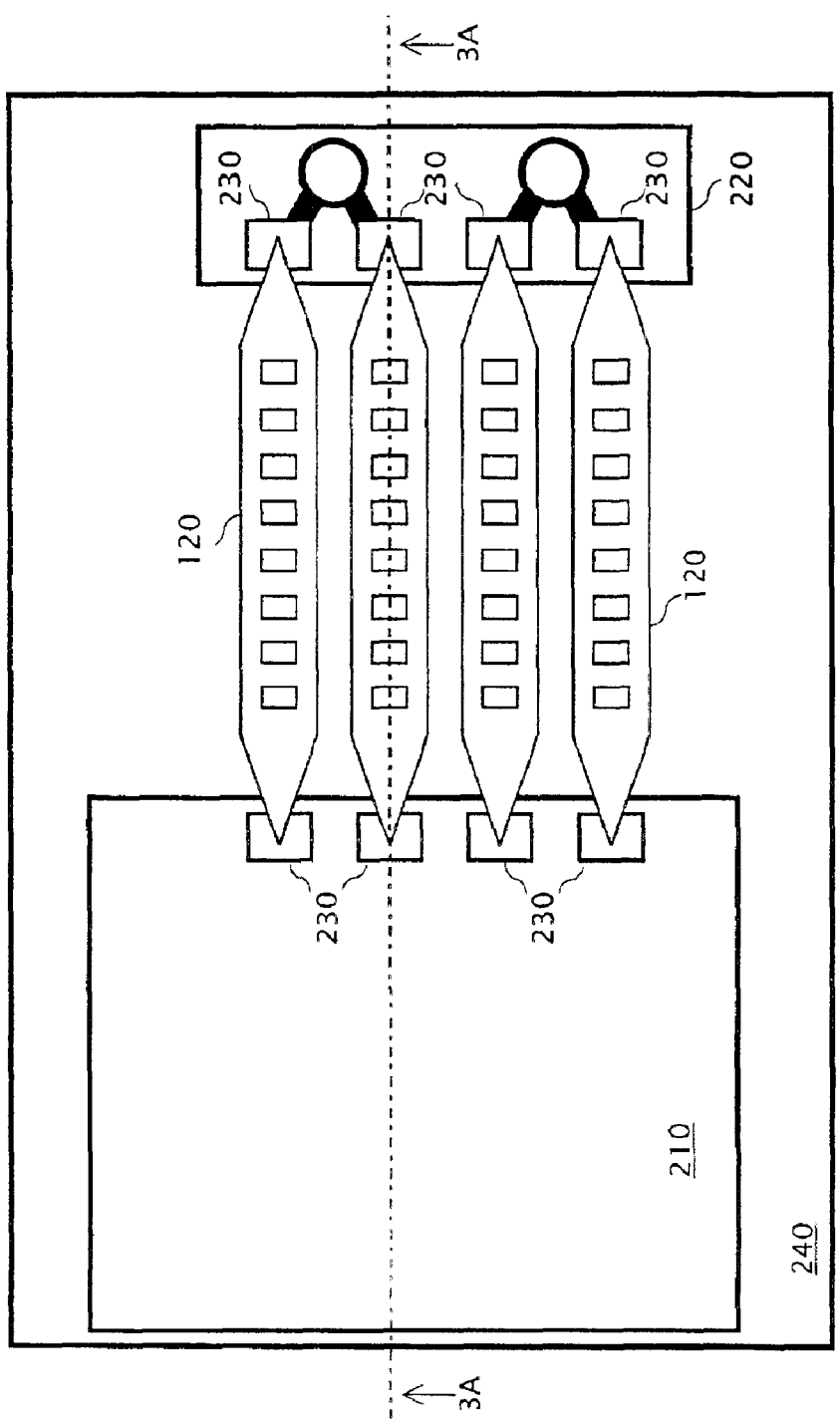

FIGS. 3A and 3B show the same example package, according to an embodiment of the invention, with the electronic devices interconnected by the conductors after substrate 110 is removed.

Conductors 120 are straight and flat, as shown in FIGS. 1A, 2A and 3A; that is, each conductor has a first planar surface and a second planar surface that are substantially parallel to each other. As shown in FIGS. 1A and 2A, the first surface of each conductor is detachably attached to the active surface of substrate 110. As shown in FIG. 2A, the second surface of each conductor is substantially parallel and adjacent to two of pads 230. Then as shown in FIG. 3A, the second surface of each conductor is electronically connected and mechanically bonded to the two pads 230.

Compared to wire bonds, ribbon bonds or other techniques in which each conductor is shaped into an arch as it is placed, the fact that conductors 120 are planar minimizes their length and thus advantageously reduces their parasitic electrical properties.

In the example embodiment shown in FIGS. 1A through 3B, conductors 120 are tapered and meshed in the plane of the active surface of substrate 110, or in the plane of the surface of pads 230. By tapering the conductors, their ends can be narrowed to a size and shape suitable for bonding to pads of electronic or opto-electronic devices, yet the conductor can be wide for most of its length so as to reduce its parasitic inductance. By using a meshed conductor, that is, one with a pattern of through holes along the length of the conductor, the parasitic capacitance of the conductor is reduced.

In practice, the geometry of the conductors will be customized based on the details of the particular package and devices that are to be interconnected. In various embodiments of the invention, the two dimensional shape of the conductors may have, among other shapes, a meshed shape, a tapered shape, a curved shape, a straight shape or a shape that is a combination of two or more of those shapes.

The exact control of the size, shape and relative positions of the conductors afforded by the invention allows the inductance, capacitance and resistance of a conductor, or even the mutual inductance or capacitance between adjacent conductors, to be selected, tuned or adjusted as desired. This is advantageous in the design of systems that include opto-electronic devices, particularly in cases where the electrical properties of an opto-electronic device are complex or vary over time, such as is the case for an opto-electronic laser.

This exact control of the conductors also allows the pads used as electronic connection points on the interconnected devices to be relatively small and close together in pitch. This is advantageous over interconnection techniques including, among others, wire bonding or ribbon bonding that manually place individual conductors between devices.

Further, the invention may produce more accurate control over the geometry of the conductors compared to interconnection techniques such as automated wire bonding or ribbon bonding that individually place conductors. Conductors with precisely controlled geometry and position can be used with pads on electronic devices that are smaller and that are closer together in pitch than conductors that individually differ in either or both of length and shape.

This exact control of the conductors afforded by the invention also allows interconnection patterns to be used that are irregular because, for example, they may need to accommodate features of the optics part of the system. In some systems, it is beneficial to set the positioning of opto-electronic devices based on optical considerations, such as the size and spacing of an array of lenses that receive the light emitted from (or that transmit light to) the opto-electronic devices or other optical considerations. Such optical considerations are not always uniform or regular. For example, some lens arrays may have additional spacing between some of the lenses for a device or material that provides additional mechanical strength or rigidity to the array.

FIGS. 4A and 4B show another embodiment of the invention in which another example package has two devices that are interconnected by curved conductors. Curved conductors may or may not be additionally meshed, though non-meshed conductors are shown to clarify the drawing. Curved conductors, or conductors with even more irregular shape, may be useful in matching the pitch of pads 230 within electronic device 210 to the pitch of pads 230 within opto-electronic device 220. In some embodiments of the invention, curved connectors advantageously allow the pitch at which adjacent opto-electronic devices 220 emit or receive light to be based on optical and mechanical considerations, and not on the size requirements of the circuitry or other features within electronic device 210. Substrate 110 is not shown here but it would be used as an interim device, as previously described.

In some embodiments of the invention, conductors 120 are held to substrate 110 using an adhesive material including, among others, an adhesive that holds a thin metallic film to a cellophane sheet or roll. Alternatively, the substrate may be ultraviolet (UV) tape that includes an adhesive that is sensitive to UV light and that loses its adhesive properties after sufficient exposure.

The invention may be practiced using a completely rigid substrate, a flexible substrate, a compressible substrate, or a substrate with limited ability to flex or compress. Various degrees of rigidity in substrate 110 may be desirable to better work with the particular electronic or opto-electronic devices at hand and the particular packaging that holds these devices in place. For example, some variation in the height of the pads of the devices mounted in the package can be accommodated by a substrate with an ability to flex or compress. The choice of a rigid substrate, a flexible substrate or a compressible substrate can support interconnecting a variety of device types using a variety of packaging techniques.

In some embodiments of the invention, the conductors are formed by photolithographic patterning to determine the two-dimensional shape of the conductors in the plane of the active surface of substrate 110. This allows complete control over the two-dimensional shape of the conductors. Then, electroplating may be use to obtain conductors of the desired thickness in the direction perpendicular to the active surface of substrate 110.

For example, a metallic film may be deposited on the major surface of substrate 110. A layer of photoresist may be deposited on the metallic film, and then photolithographically exposed with light that is patterned from a mask or reticle. The features in the mask or reticle are designed based on the particular interconnections to be made among the electronic or opto-electronic devices. The photoresist is then developed to remove the unwanted regions, as defined by the mask, and then the metallic film is etched away where it is not protected by the photoresist.

In some embodiments of the invention, the patterned metallic film is then subjected to an electroplating process, which results in conductors of the desired thickness being formed according to the two dimensional pattern of the mask or reticle. Using electroplating to form the conductors may allow the thickness of the conductor to be in the range of 10 to 50 micrometers ($\mu$m).

In other embodiments of the invention, the conductors are formed by stamping a sheet of conductive material to determine the two-dimensional shape of the conductors. Using stamping to form the conductors may allow the thickness of the conductor to be in the range of 25 to 100 micrometers.

All conductors are formed at the same time in embodiments of the invention that use photolithography to pattern the conductors, in embodiments that stamp the conductors out of a metal sheet, and in some other embodiments. Forming the conductors in a single operation has advantages over techniques such as ribbon or wire bonding in which each conductor must be individually formed and added. One such advantage is that manufacturing throughput is increased because substantially fewer operations are needed.

Another advantage is that forming the conductors at the same time supports automated manufacturing better than interconnection techniques that form and add conductors one at a time. Automated manufacturing can, of course, reduce manufacturing cost and support volume production, both of which are particularly beneficial for systems that include optical communications links.

As shown in FIGS. 2A and 2B, by aligning substrate 110 with package 240, an end of every conductor is simultaneously aligned with a respective pad 230 of devices 210 and 220; that is, all conductors are in position after a single alignment operation. A single alignment operation has advantages over techniques such as ribbon or wire bonding in which both ends of each ribbon or wire must be individually aligned. One such advantage is that manufacturing throughput is increased because substantially fewer alignment operations are needed.

A single alignment operation can reduce manufacturing defects and field defects which may both be due to misalignment. Because a single alignment operation can be precisely controlled easier than multiple operations, the occurance of misaligned conductors can be reduced. Misaligned conductors can lead to open connections or to shorts between conductors or pads. Misaligned conductors can also lead to connections that are initially correct but will, over time, short or open. Thus both manufacturing defects and field defects may be reduced by employing the single alignment procedure described.

Further, it is easier to automate interconnection techniques that use a single alignment operation compared to techniques that use repeated alignment operations performed on individual conductors. Automated manufacturing can reduce manufacturing cost and can support volume production, both of which are particularly beneficial in systems that include optical communications links.

In some embodiments of the invention, the substrate 110 contains a through hole at a point where a particular conductor 120 contacts a particular pad 230. The bonding of the particular conductor to the particular pad may include inserting a bonding tip into the hole or directing a laser beam into the hole.

In other embodiments of the invention, substrate 110 is transparent at the wavelength of a laser and the bonding of conductors 120 to pads 230 includes passing a laser beam through the substrate.

In some embodiments of the invention, substrate 110 is simply pulled off the conductors after they are bonded to the devices. In such embodiments, a relatively weak adhesive may be used, that is, an adhesive strong enough to keep conductors 120 attached to substrate 110 during handling but weak enough to allow the substrate to be easily detached after conductors 120 are bonded to pads 230.

In other embodiments of the invention, substrate 110 is detached from the conductors by altering the adhesion between the conductors and the substrate. The adhesion may be altered thermally, chemically, by exposure to light, by a combination thereof, or by some other process.

The detachable substrate of the invention allows interconnecting electronic and opto-electronic devices that are tightly or densely packed within a package. Because substrate 110 is not present in the finished, packaged device, the electronic or opto-electronic devices that are interconnected can be closer together than is possible using other interconnection techniques, such as some tape array bonding (TAB) techniques. In some TAB bonding techniques, there must be significant separation between devices in order to accommodate a lead frame, tape, or other substrate that secure the conductors both during the packaging process and afterward in the finished device.

Some embodiments of the invention comprise a package including plurality of electronic devices with conductors bonded to the pads of the devices. Each conductor is self supporting between the devices, has a two dimensional shape and has a surface that is substantially parallel to an exposed surface of the pads. An example of such a package is shown in FIGS. 3A and 3B.

Other embodiments of the invention comprise a substrate and a plurality of conductors configured to be used in interconnecting electronic devices, wherein the conductors are detachably attached to the substrate but otherwise physically independent of each other. An example of such a package is shown in FIGS. 1A and 1B.

Accordingly, the invention as described herein provides a method and apparatus that enables interconnecting electronic devices including, among others, opto-electronic devices. The invention may be used to interconnect an electronic device with an opto-electronic device, to interconnect two electronic devices, one of which also interconnects with an opto-electronic device, or to interconnect electronic devices in a system that does not include opto-electronic devices.

The foregoing drawing figures and descriptions are not intended to be exhaustive or to limit the invention to the forms disclosed. Rather, they are presented for purposes of illustrating, teaching and aiding in the comprehension of the invention. The invention may be practiced without the specific details described herein. Numerous selections among alternatives, changes in form, and improvements can be made without departing from the principles, intent or essence of the invention. The invention can be modified or varied in light of the teachings herein, the techniques known to those skilled in the art, and advances in the art yet to be made. The scope of the invention for which a patent is sought is set forth by the following claims and their legal equivalents.

What is claimed is:

1. A package of interconnected electronic devices, the package comprising:
   a plurality of electronic devices, each including at least one pad; and
   a conductor bonded to one of the pads on each of at least two of the electronic devices, wherein the conductor is self supporting between the devices and has a surface substantially coplanar with a surface of the at least two pads.

2. The package of claim 1, wherein at least one of the electronic devices is a device selected from the group consisting of: an opto-electronic device; a semiconductor laser; a photodiode; an electro-optic device; a light emitting diode; an electro-absorption modulator; a semiconductor optical amplifier; and a combination thereof.

3. The package of claim 1, wherein the conductor has a two dimensional shape, the shape being selected from the group consisting of: a tapered shape; a curved shape; a meshed shape; a straight shape; and a shape that is a combination thereof.

4. A package of interconnected electronic devices, the package comprising:
   a plurality of electronic devices, each including at least one pad; and
   a conductor means for electronically connecting one of the pads on one of the electronic devices to one of the pads on another of the electronic devices, the conductor means being self supporting between the electronic devices and including a surface substantially parallel to surfaces of the pads.

5. The package of claim 4, wherein at least one of the electronic devices is selected from the group consisting of: an opto-electronic device; a semiconductor device; a photodiode; an electro-optic device; a light emitting diode; an electro-absorption modulator; a semiconductor optical amplifier; and a combination thereof.

6. The package of claim 4, wherein the conductor means has a two-dimensional shape in a plane parallel to the surfaces of the pads, the shape being selected from the group consisting of: a tapered shape; a curved shape; a meshed shape; a straight shape; and a shape that is a combination thereof.

7. An apparatus for interconnecting electronic devices, the apparatus comprising:
   a substrate having an extended surface;
   a plurality of conductors having a generally flat surface, said generally flat surface being detachably attached to the extended surface of said substrate, the conductors being laterally spaced on said substrate extended surface and being otherwise physically independent of each other.

8. The apparatus of claim 7, wherein each conductor has a two dimensional shape selected from the group consisting of: a tapered shape; a curved shape; a meshed shape; a straight shape; and a shape that is a combination thereof.

9. The apparatus of claim 7, wherein the substrate comprises a material selected from a group consisting of: a silicon based material; a glass based material; a polyimide based material; an acrylic based material; a cellophane based material; and a material that is a combination thereof.

10. A package of interconnected electronic devices, the package comprising:
    a plurality of first and second electronic devices, each including at least one pad, said first electronic device being spaced from said second electronic device;

a substrate; and a plurality of flat, spaced, elongated conductors detachably secured to said substrate, said substrate being removably mounted to said package with the ends of each said conductor being aligned with and bonded on one pad of a first electronic device and with one pad of a second electronic device spaced from said first electronic device, and said conductors being self supporting between said respective pads when said substrate is removed from said conductors and from said package.

11. The package of claim 10, wherein the ends of said conductors which are bonded on said pads are reduced in width in relation to the width of the portion of said conductors extending between said pads.

12. The package of claim 10, wherein said conductors have holes therethrough forming a mesh configuration.

13. The package of claim 10, wherein said conductors are shaped and configured, and their relative positions are determined to provide predetermined inductance, capacitance and resistance of each said conductor, as well as predetermined mutual inductance or capacitance between adjacent conductors.

14. The package of claim 10, wherein said pads on at least some of said first electronic devices are in a plane different from the plane of said pads on at least some of said second electronic devices, the end of said conductors being substantially coplanar with said pads on which they are bonded.

15. The package of claim 10, wherein the mutually contacting surfaces of each of said pads and the respective bonded ends of each of said conductors are substantially coplanar.

* * * * *